United States Patent
Park

(10) Patent No.: US 8,050,098 B2
(45) Date of Patent: Nov. 1, 2011

(54) PROGRAM METHOD OF NONVOLATILE MEMORY DEVICE

(75) Inventor: Seong Je Park, Gyeongsangnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 452 days.

(21) Appl. No.: 12/362,467

(22) Filed: Jan. 29, 2009

(65) Prior Publication Data

US 2009/0290420 A1    Nov. 26, 2009

(30) Foreign Application Priority Data

May 20, 2008  (KR) .................. 10-2008-0046603

(51) Int. Cl.
*G11C 16/04*  (2006.01)

(52) U.S. Cl. ......... 365/185.18; 365/185.22; 365/185.25; 365/185.17; 365/185.13

(58) Field of Classification Search ............. 365/185.18, 365/185.22, 185.25, 185.17, 185.13
See application file for complete search history.

(56) References Cited

U.S. PATENT DOCUMENTS

| | | | |
|---|---|---|---|
| 7,719,891 B2 * | 5/2010 | Lim | 365/185.09 |
| 2009/0161437 A1 * | 6/2009 | Pyeon et al. | 365/185.17 |

FOREIGN PATENT DOCUMENTS

| | | | |
|---|---|---|---|
| KR | 1020070004295 A | 1/2007 | |
| KR | 1020080038924 A | 5/2008 | |

OTHER PUBLICATIONS

Notice of Preliminary Rejection issued from Korean Intellectual Property Office on Mar. 25, 2010.
Notice of Preliminary Rejection issued from Korean Intellectual Property Office on Oct. 22, 2009.

* cited by examiner

*Primary Examiner* — Tuan T. Nguyen
(74) *Attorney, Agent, or Firm* — IP & T Group LLP

(57) ABSTRACT

A program method of nonvolatile memory devices, which can solve an under program problem by preventing a drop of a verify voltage in the program, and verify operations. According to an aspect of the method, a program operation is performed on a selected memory cell block. Electric charges charged to a channel of memory cell strings included in unselected memory cell blocks are discharged. A verify operation is performed on the selected memory cell block.

9 Claims, 4 Drawing Sheets

US 8,050,098 B2

PROGRAM METHOD OF NONVOLATILE MEMORY DEVICE

CROSS-REFERENCE TO RELATED APPLICATION

The present application claims priority to Korean patent application number 10-2008-0046603, filed on May 20, 2008, which is incorporated by reference in its entirety.

BACKGROUND OF THE INVENTION

The present invention relates to a method of programming nonvolatile memory devices.

In recent years, there has been an increasing demand for nonvolatile memory devices that can be electrically programmed and erased and do not need the refresh function of rewriting data at specific intervals.

The nonvolatile memory cell is an element enabling electrical program/erase operations and is configured to perform the program and erase operations by changing its threshold voltage as electrons are migrated by a strong electric field applied to a thin oxide layer.

The nonvolatile memory device generally includes a memory cell array in which cells for storing data are arranged in matrix form, and a page buffer for writing memory into specific cells of the memory cell array or reading memory stored in specific cells. The page buffer includes a bit line pair connected to a specific memory cell, a register for temporarily storing data to be written into a memory cell array, or reading data of a specific cell from the memory cell array and temporarily storing the read data therein. The page buffer further includes a sensing node for sensing the voltage level of a specific bit line or a specific register, and a bit line selection unit for controlling whether or not to connect a specific bit line to the sensing node.

In the program and verify operations of this nonvolatile memory device, a problem arises because leakage current is generated by a memory cell block on which the program operation has not been performed. Consequently, an under program phenomenon occurs, in which the level of a verify voltage applied to a memory cell block on which the verify operation has been performed is lowered, and, therefore, the threshold voltage of a target program cell is lowered.

BRIEF SUMMARY OF THE INVENTION

The present invention is directed towards a method of programming nonvolatile memory devices, which can solve the under program problem by preventing a drop of a verify voltage in the program, and can verify operations.

A method of programming nonvolatile memory devices according to an aspect of the invention includes executing a program operation on a selected memory cell block, discharging electric charges charged to a channel of memory cell strings included in unselected memory cell blocks, and executing a verify or verification operation on the selected memory cell block.

A program method of nonvolatile memory devices according to another aspect of the invention includes executing a program operation on a selected memory cell block, connecting unselected memory cell blocks and a global word line, grounding a common source line and a variable voltage input terminal, and discharging electric charges charged to a channel of memory cell strings included in the unselected memory cell blocks.

DESCRIPTION OF A SPECIFIC EMBODIMENT

Now, a specific embodiment according to the present invention will be described with reference to the accompanying drawings. However, the invention is not limited to the disclosed embodiment, but may be implemented in various ways. The embodiment is provided to complete the disclosure of the invention and to allow those having ordinary skill in the art to understand the scope of the invention. The invention is defined by the claims.

Figure 1:
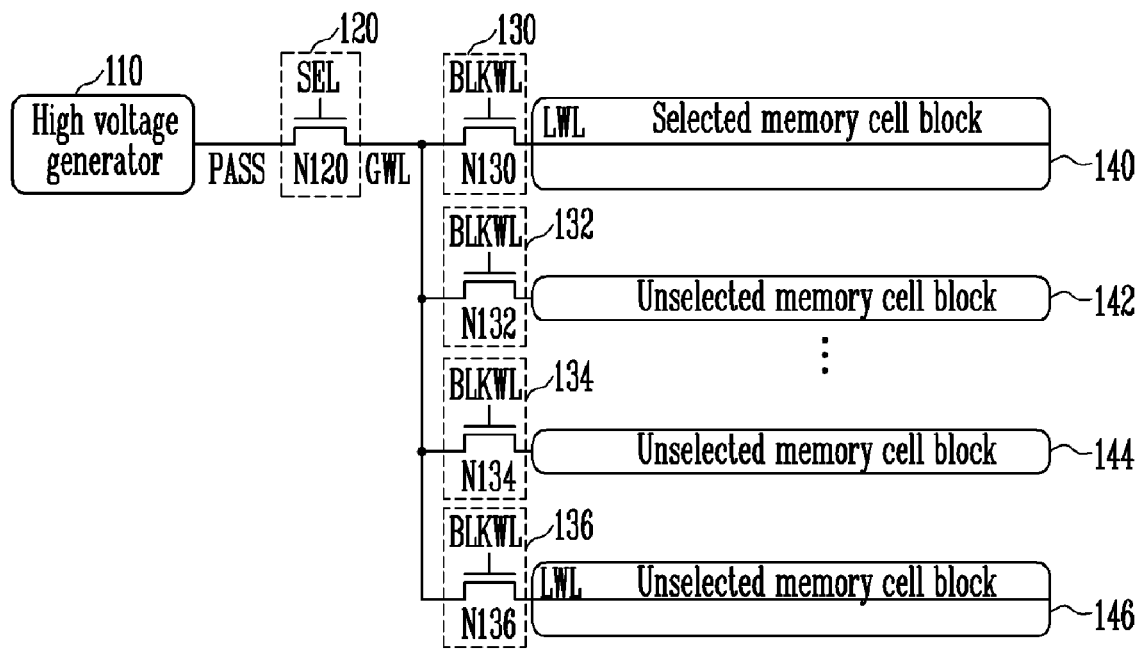
FIG. 1 is a diagram showing the configuration of a memory cell block of a typical nonvolatile memory device.

FIG. 1 is a diagram showing the configuration of a memory cell block of a typical nonvolatile memory device.

A nonvolatile memory device 100 includes memory cell blocks 140, 142, 144, and 146, a high voltage generator 110 for generating and transferring high voltages such as a program voltage, a pass voltage, read/verify voltages, and an erase voltage, a global high voltage switching unit 120 for transferring the various high voltages, received from the high voltage generator 110, to a global word line GWL, and local high voltage switching units 130, 132, 134, and 136 for selectively transferring the various high voltages, received through the global word line GWL, to respective memory cell blocks through local word lines LWL.

The high voltage generator 110 includes a pump circuit (not shown) for generating high voltages and a regulator circuit (not shown) for regulating the high voltages, which are output from the pump circuit, to a specific level. Thus, the high voltage generator 110 can generate various high voltages used in a program operation, an erase operation, and read/verify operations.

The global high voltage switching unit 120 is connected between the high voltage generator 110 and the global word line GWL and includes a switching element N120, which is turned on in response to a control signal SEL. Accordingly, the high voltages are applied to the global word line GWL when the control signal SEL is applied.

The local high voltage switching units 130, 132, 134, and 136 include first to $n^{th}$ local high voltage switching elements N130, N132, N134, and N136 for selectively transferring various high voltages, which are received through the global word line GWL, to respective memory cell blocks through the local word lines LWL. The respective local high voltage switching elements are coupled between the global word line and each memory cell block and is turned on in response to a block select signal BLKWL transferred from a block switch (not shown).

In this configuration, in the case in which a program operation is performed on a specific memory cell block 140, the local high voltage switching element N130 coupled to the corresponding memory cell block is turned on and therefore transfers the program voltage, the pass voltage, etc., which are received through the global word line, to the corresponding memory cell block. The local high voltage switching elements N132, N134, and N136 coupled to unselected memory cell blocks are turned off to thereby block the high voltages received through the global word line. That is, the local word lines LWL of the unselected memory cell blocks go into a floating state. At this time, a problem arises because the leakage current is generated in the unselected memory cell blocks and, consequently, the level of the high voltage applied to the selected memory cell block is lowered.

FIG. 2 is a view illustrating a phenomenon in which the leakage current is generated in unselected memory cell blocks when program and verify operations are performed in the typical nonvolatile memory device.

FIG. 2 A is a sectional view of a memory cell string, illustrating the state of unselected memory cell blocks, in the case in which a program operation is performed in a selected memory cell block. One memory cell block includes a number of memory cell strings. Each of memory cells MC0, MC1, . . . , MCn includes a control gate and a floating gate. The memory cells are connected to each other in series. Meanwhile, the memory cell block includes a drain select transistor DST selectively connecting the memory cell MCn and a bit line BL and a source select transistor SST commonly connecting the memory cell MC0 and a common source line CSL.

At the time of a program operation, a program voltage Vpgm and a pass voltage Vpass are applied through the global word line GWL. The voltages are transferred to the local word lines LWL of the selected memory cell block. The common source line CSL is sustained at a high level. In the event of a bit line BL, a target program cell has to be sustained at a low level and a target erase cell has to be sustained at a high level. To this end, in the state where a variable voltage input terminal VIRPWR of a page buffer is sustained at a high level, a bit line connected to the target program cell is discharged to a low level. Here, the common source line CSL and the variable voltage input terminal VIRPWR are commonly connected to different memory cell blocks, so they have the same voltage irrespective of whether a corresponding block has been selected or not. In other words, voltages applied to the drain select transistor DST, the source select transistor SST, and a gate of the memory cell MC are applied through the local word lines LWL and therefore applied to only a selected memory cell. However, the common source line CSL and the variable voltage input terminal VIRPWR have their entire memory cell blocks commonly connected and therefore have the same voltage irrespective of whether a corresponding block has been selected or not.

At this time, the memory cell strings of the unselected memory cell blocks are also partially influenced by the program operation of the selected memory cell block. That is, the unselected memory cells are also applied a high level voltage VCC through the common source line CSL and the variable voltage input terminal VIRPWR, and each select transistor and the gate of each memory cell are floated. Accordingly, the gate voltage of the drain select transistor DST also rises due to junction coupling capacitance between the bit line BL and the drain select transistor DST. Charges on the bit line BL are introduced to a channel of the memory cell string because of the increased gate voltage. In a similar way, the gate voltage of the source select transistor SST also rises due to junction coupling capacitance between the common source line CSL and the source select transistor SST. Charges on the common source line CSL are introduced to the channel of the memory cell string because of the increased gate voltage. At the time of a program operation, charges are introduced to the channel due to bouncing of each select transistor and then sustained at a specific level.

Figure 2A:
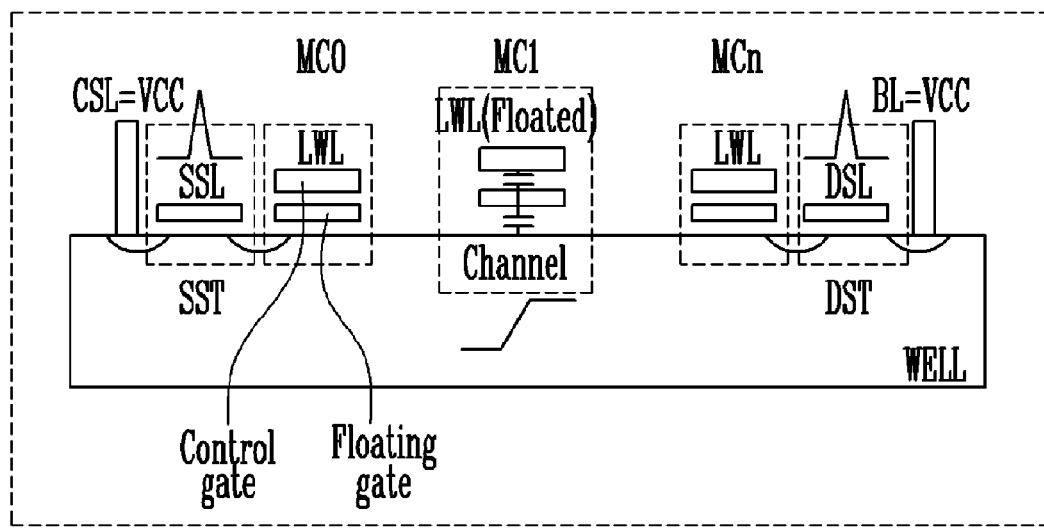
FIGS. 2A and 2B are views illustrating a phenomenon in which leakage current is generated in unselected memory cell blocks when program and verify operations are performed in a typical nonvolatile memory device.
Figure 2B:
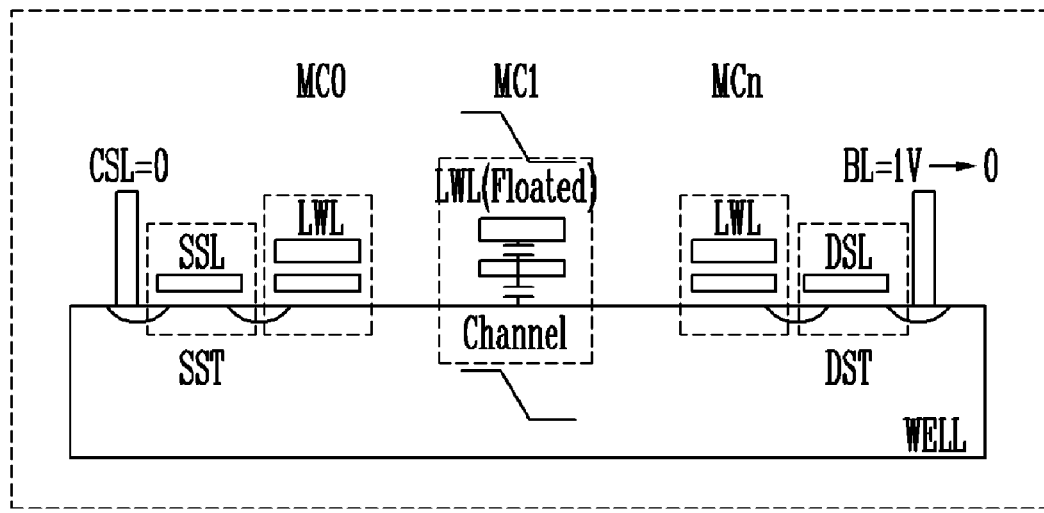

FIG. 2B is a sectional view of a memory cell string, illustrating the state of unselected memory cell blocks, in the case in which a verify operation is performed in a selected memory cell block.

At the time of a verify operation, both voltages applied to the common source line CSL and the variable voltage input terminal VIRPWR shift to a low level. In a verify operation, in order to check whether a cell has been programmed, a bit line precharged to a high level is connected to a memory cell string, including a target verify cell, so as to check whether the voltage level of the bit line has changed. Here, the common source line is grounded and a sensing node of a page buffer is precharged, thus precharging the bit line. In other words, the bit line is precharged without passing through the variable voltage input terminal VIRPWR. In the case in which a target verify cell is programmed, the corresponding cell is turned off, so that a current path via a cell string is not formed and therefore the bit line is sustained at a precharged voltage level. However, in the case in which a target verify cell is not programmed, the corresponding cell is turned on, so that a current path is formed and the bit line is discharged to the ground. For this configuration, both voltages applied to the common source line CSL and the variable voltage input terminal VIRPWR are made to become a low level. This is evident to those having ordinary skill in the art and description thereof is omitted for simplicity.

Meanwhile, in this verify operation, the common source line CSL and the variable voltage input terminal VIRPWR are sustained at a low level. Therefore, electric charges are no longer introduced to the channel and electric charges of the channel begin discharging through the leakage current. During the verify operation of the selected memory cell block, this leakage current is generated in unselected memory cell blocks. Accordingly, a problem arise because the level of a verify voltage applied to the selected memory cell block is lowered. Consequently, an under program phenomenon occurs in which the threshold voltage of the entire target program cells is lowered to below a target voltage since the verify voltage applied to each word line is lowered.

Figure 3:
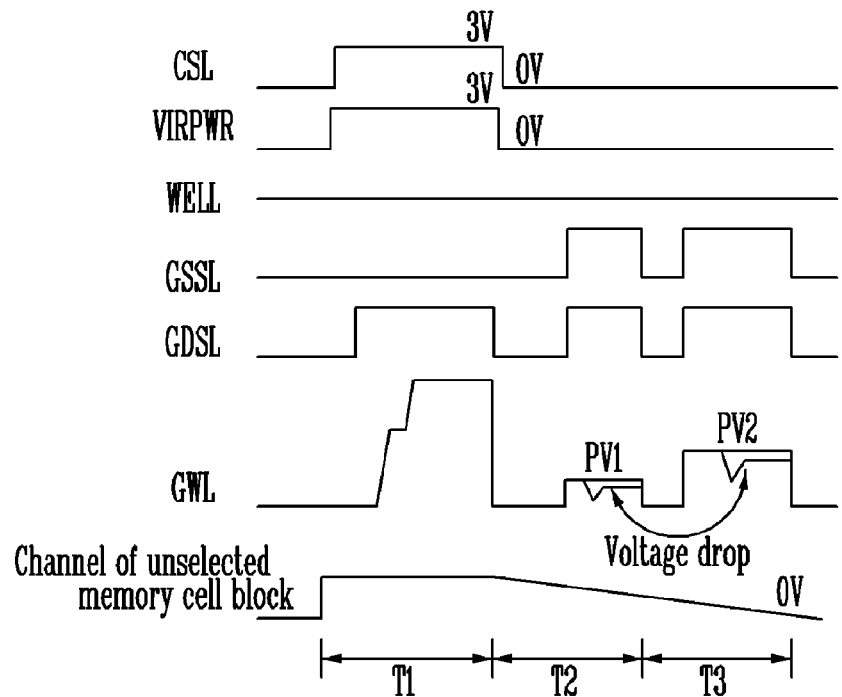
FIG. 3 shows a waveform illustrating voltages applied to unselected memory cell blocks in the program and verify operations of a typical nonvolatile memory device.

FIG. 3 shows a waveform illustrating voltages applied to unselected memory cell blocks in the program and verify operations of the typical nonvolatile memory device.

First, the common source line CSL and the variable voltage input terminal VIRPWR are sustained at a high level, and a global drain select line GDSL and the global word line GWL are applied with a high level voltage in order to perform a program operation (T1). As mentioned earlier, when a program operation is executed, a channel of cell strings included in unselected memory cell blocks is charged and therefore has a specific voltage level of 0V or higher.

A verify operation is then performed according to a verify voltage PV1 transferred from the global word line GWL (T2). At this time, as described above with reference to FIG. 2B, as electric charge in a channel of unselected memory cell blocks is gradually discharged, the verify voltage PV1 of the global word line GWL is slightly lowered. Even in the case in which a plurality of verify operations is executed after once program operation is performed according to a multi-level cell program operation, a verify voltage PV2 is also lowered in the same manner as above. Voltage of the global word line GWL is transferred to the local word lines LWL without change and then applied to the gates of the respective memory cells. Here, since the verify voltage is lowered, an under program phenomenon occurs in which the threshold voltage of the entire target program cells becomes lower than a target voltage.

Figure 4:
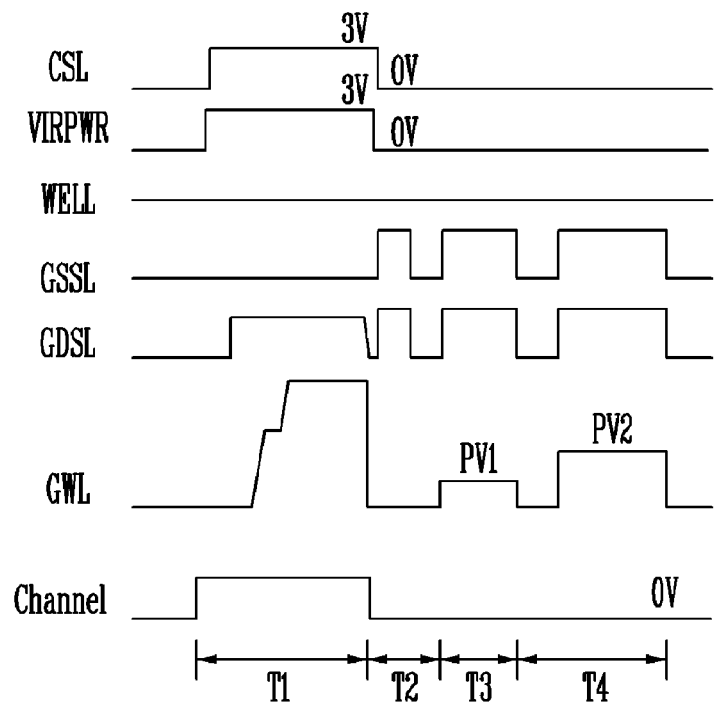
FIG. 4 shows a waveform illustrating voltages applied to unselected memory cell blocks in the program and verify operations of a nonvolatile memory device in accordance with an embodiment of the present invention.
Figure 5:
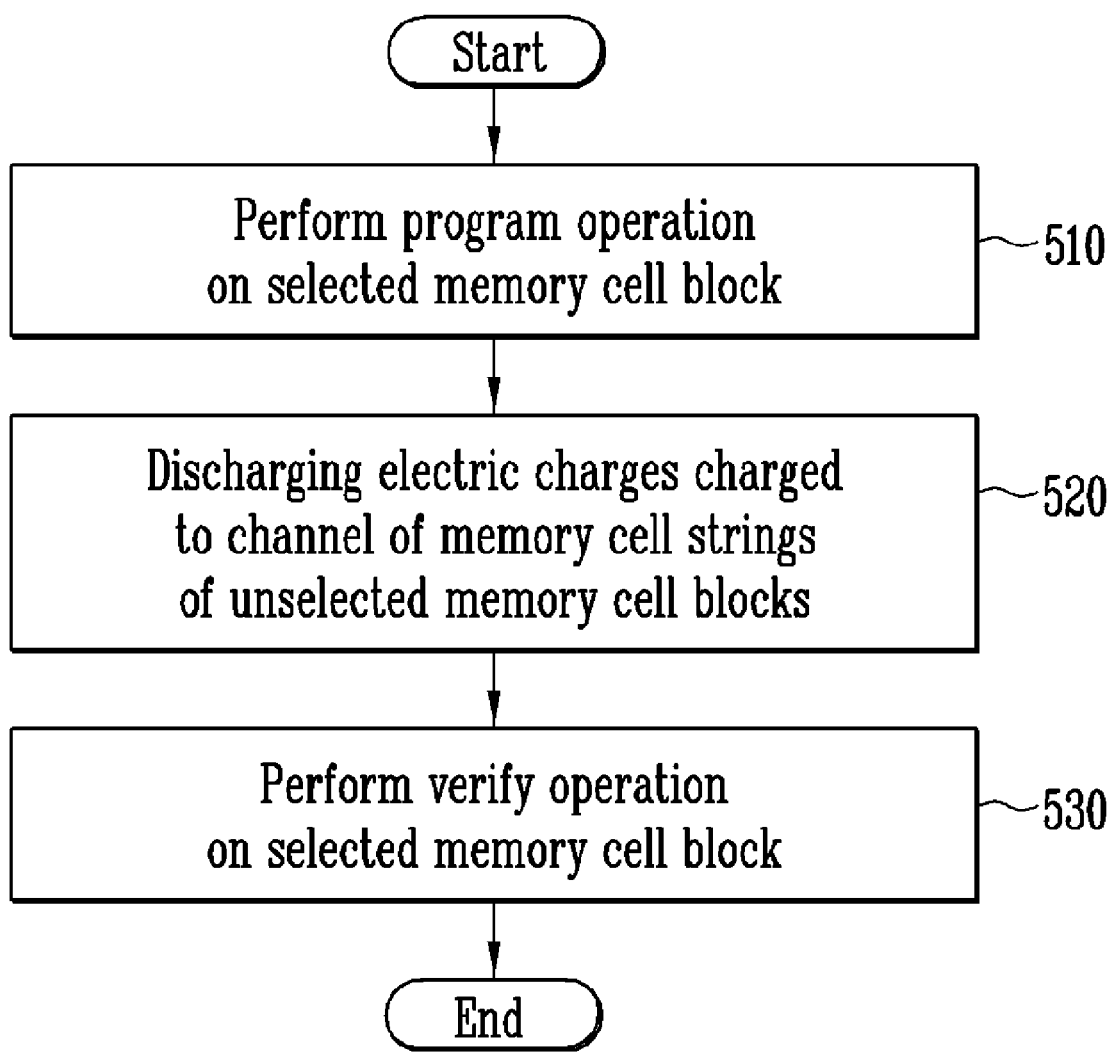
FIG. 5 is a flowchart illustrating a method of programming nonvolatile memory devices in accordance with an embodiment of the invention.

FIG. 4 shows waveforms illustrating voltages applied to unselected memory cell blocks in the program and verify operations of a nonvolatile memory device in accordance with an embodiment of the invention. FIG. 5 is a flowchart illustrating a method of programming nonvolatile memory devices in accordance with an embodiment of the invention.

First, a program operation is performed on a selected memory cell block in step 510.

To this end, the common source line CSL and the variable voltage input terminal VIRPWR are sustained at a high level, and a high level voltage (T1) is applied to the global drain select line GDSL and the global word line GWL. As mentioned earlier, when a program operation is performed, a channel of cell strings included in unselected memory cell blocks is charged, and therefore has a specific voltage level of 0V or higher. This is identical to that of FIG. 3.

Next, the charge in the channel of the cell strings included in the unselected memory cell blocks is discharged in step 520.

To this end, after the common source line CSL and the variable voltage input terminal VIRPWR shift to a low level, the drain select transistor DST and the source select transistor SST of the unselected memory cell block are turned on for a specific period of time (T2). That is, the local high voltage switching units 130, 132, 134, and 136 of the unselected memory cell block are turned on through a block switch (not shown). At the same time, the pass voltage Vpass of the high voltage generator is applied to each of the drain select transistor DST and the source select transistor SST through the global word line GWL and the global source and drain select lines GSSL and GDSL. In accordance with this operation, as shown in FIG. 2A, charge in the channel of the cell strings is temporarily discharged through the common source line CSL, being in a ground state, and the variable voltage input terminal VIRPWR.

Next, a verify operation is performed on the selected memory cell block in step 530.

Here, the verify operation is performed using a verify voltage PV1 transferred from the global word line GWL (T3, T4). Prior to execution of the verify operation, the charge in the channel of the cell strings included in the unselected memory cell blocks is temporarily discharged, so the leakage current occurring in the verify operation can be maximized. It is intended that the level of the verify voltage transferred through the global word line GWL is not lowered, but can be sustained at a target level. This configuration can prevent the under program phenomenon from occurring.

According to the configuration of the invention, a phenomenon in which a verify voltage applied to a selected memory cell block drops due to unselected memory cell blocks can be prevented. Accordingly, the invention is advantageous in that it can prevent the occurrence of the under program phenomenon in which the threshold voltage of a target program cell is lowered.

The embodiment disclosed herein has been proposed to allow a person skilled in the art to easily implement the invention, and the person skilled in the part may implement the invention in various ways. Therefore, the scope of the invention is not limited by or to the embodiment as described above, and should be construed to be defined only by the appended claims and their equivalents.

What is claimed is:

1. A method of programming nonvolatile memory devices, the method comprising:
    executing a program operation on a selected memory cell block;
    discharging electric charge from a channel of memory cell strings included in unselected memory cell blocks; and
    executing a verify operation on the selected memory cell block.

2. The programming method of claim 1, wherein the execution of the program operation includes applying a power supply voltage to a common source line and a variable voltage input terminal, and transferring a program voltage and a pass voltage, which are transferred through a global word line, to the selected memory cell block.

3. The programming method of claim 1, wherein said discharging includes
    turning on a local high voltage switching unit connected to the unselected memory cell blocks,
    grounding a common source line and a variable voltage input terminal, and
    applying a pass voltage, which is transferred through a global word line, to gates of a drain select transistor and a source select transistor included in the unselected memory cell blocks.

4. The programming method of claim 1, wherein said discharging includes
    connecting the unselected memory cell blocks to a global word line,
    grounding a common source line and a variable voltage input terminal, and
    applying a high voltage to gates of a drain select transistor and a source select transistor, which are included in the unselected memory cell blocks, through the global word line.

5. The programming method of claim 1, wherein the execution of the verify operation includes blocking connection of the unselected memory cell blocks and a global word line and applying a verify voltage to the selected memory cell block.

6. A method of programming nonvolatile memory devices, the method comprising:
    executing a program operation on a selected memory cell block;
    connecting unselected memory cell blocks and a global word line;
    grounding a common source line and a variable voltage input terminal; and
    discharging charge from a channel of memory cell strings included in the unselected memory cell blocks.

7. The programming method of claim 6, further comprising executing a verify operation on the selected memory cell block.

8. The programming method of claim 6, wherein the discharging of the electric charges charged to the channel of the memory cell strings includes applying a high voltage to gates of a drain select transistor and a source select transistor, which are included in the unselected memory cell blocks, through the global word line.

9. The method of claim 6, wherein the discharging of charge from the channel of the memory cell strings includes turning on a drain select transistor and a source select transistor included in the unselected memory cell blocks.

* * * * *